United States Patent
Olney et al.

(10) Patent No.: US 7,778,318 B1
(45) Date of Patent: Aug. 17, 2010

(54) OFDM GAIN COMPRESSION MEASUREMENT

(75) Inventors: Doug Olney, Santa Rosa, CA (US); Mike Hart, Healdsburg, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 561 days.

(21) Appl. No.: 11/839,312

(22) Filed: Aug. 15, 2007

(51) Int. Cl.
*H04B 3/46* (2006.01)
*H04B 17/00* (2006.01)
*H04Q 1/20* (2006.01)

(52) U.S. Cl. .................................................. 375/224
(58) Field of Classification Search ................. 375/224, 375/259–260; 370/241, 252
See application file for complete search history.

(56) References Cited

U.S. PATENT DOCUMENTS

| | | | |
|---|---|---|---|
| 6,392,483 B2* | 5/2002 | Suzuki et al. ............... | 330/151 |
| 6,411,662 B1* | 6/2002 | Sakoda et al. ............... | 375/340 |
| 6,459,744 B1* | 10/2002 | Helard et al. ............... | 375/354 |
| 6,621,367 B2* | 9/2003 | Suzuki et al. ............... | 333/14 |
| 6,925,128 B2* | 8/2005 | Corral ........................ | 375/260 |
| 2003/0185179 A1* | 10/2003 | Inogai et al. ................ | 370/335 |
| 2004/0091057 A1* | 5/2004 | Yoshida ...................... | 375/260 |
| 2007/0147525 A1* | 6/2007 | Song et al. .................. | 375/260 |
| 2007/0201503 A1* | 8/2007 | Nishio ........................ | 370/437 |
| 2008/0025384 A1* | 1/2008 | Liu et al. .................... | 375/229 |

\* cited by examiner

*Primary Examiner*—Jean B Corrielus

(57) ABSTRACT

A method for measuring amplifier gain compression in an OFDM signal includes measuring the signal as a function of time to provide an observed time magnitude, demodulating the OFDM signal to determine an estimate of the ideal signal constellation points, performing an inverse FFT on the estimate of the ideal constellation points to produce an estimated ideal time magnitude, comparing the observed time magnitude to the estimated ideal time magnitude to provide a measure of amplifier gain compression.

5 Claims, 1 Drawing Sheet

OFDM GAIN COMPRESSION MEASUREMENT

BACKGROUND OF THE INVENTION

The present invention relates to the measurement of electrical signals and, in particular, to the measurement of OFDM signals.

Orthogonal frequency-division multiplexing uses many orthogonal sub-carriers (e.g., 100 to 8,000), each with a relatively low symbol rate. Each sub-carrier is modulated with a conventional modulation technique (e.g., QAM). OFDM provides very efficient use of the spectrum available.

One issue with OFDM is that the peak to average power ratio may be high. This is because at any instant, many of the sub-carriers may constructively interfere. This makes it important that the circuitry have the needed dynamic range. Often, it is the power amplifiers that are most likely to have gain compression issues (e.g., the gain falls off with input magnitude).

It can be difficult to measure gain compression in the amplifiers. A technique such as a constellation diagram may show "fuzzy" clusters, but many factors could produce a similar result besides gain compression. It is possible to apply a continuous wave signal to the amplifier and compare the input to the output, but this typically will not be representative of the performance when a complex high peak to average power ratio signal such as an OFDM signal is applied.

Similarly, a technique such as measuring the composite channel power and recording gain as power is increased with an OFDM signal could be tried. Unfortunately, because compressed time domain peaks end up being averaged with uncompressed time domain valleys, this method is of limited use.

SUMMARY OF THE INVENTION

A method for measuring amplifier gain compression in an OFDM signal includes measuring the signal as a function of time to provide an observed time magnitude, demodulating the OFDM signal to determine an estimate of the ideal signal constellation points, performing an inverse FFT on the estimate of the ideal constellation points to produce an estimated ideal time magnitude, comparing the observed time magnitude to the estimated ideal time magnitude to provide a measure of amplifier gain compression.

DESCRIPTION OF THE PREFERRED EMBODIMENTS

Figure 1:
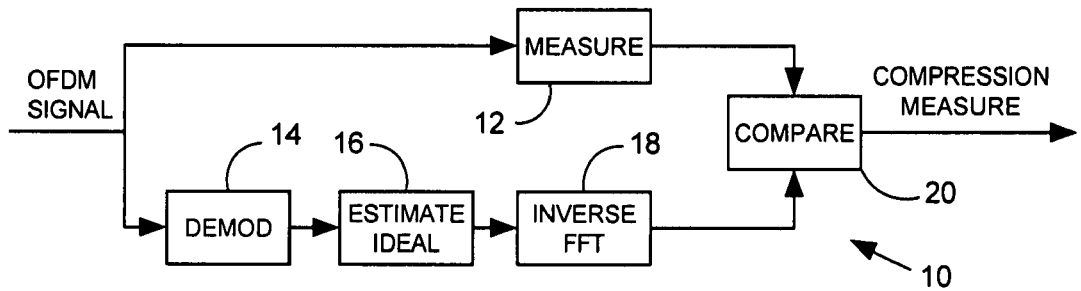
FIG. 1 is a block diagram of an example of a system that may be used with the invention.

Referring to FIG. 1, a system 10 splits an OFDM signal into one portion that is measured in the time domain by the measuring device 12. The other portion of the OFDM signal is demodulated by a demodulator 14. The demodulated signal is used to estimate 16 the ideal constellation points of the OFDM signal in the frequency domain. An inverse fast Fourier transform (FFT) 18 is then performed on the frequency domain signal to produce an estimate of the ideal time domain signal.

The magnitudes of the two time domain signals are then compared 20 to provide a measure of the gain compression present in the OFDM signal.

One useful form of this measure can be formed from the ratio of the magnitude of the time-based error to the input magnitude.

$$ObservedMagnitude - ReferenceMagnitude / FullScaleMagnitude$$

Figure 2:
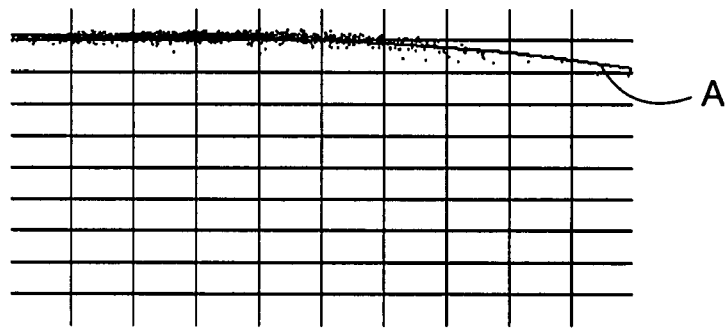
FIG. 2 is a graph of an example of an OFDM signal measurement according to an aspect of the invention

Referring to FIG. 2, a linear scattergram for an example of an OFDM signal is shown. As power increases along the horizontal axis, it can be seen that the values of the ratio in the vertical axis tail off. This OFDM signal has relatively mild gain compression.

Figure 3:
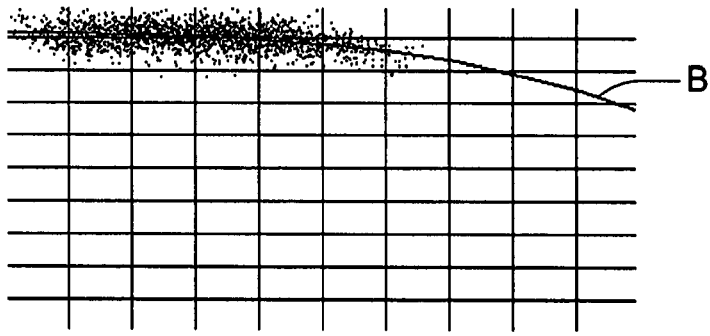
FIG. 3 is a graph of an example of an OFDM signal measurement according to another aspect of the invention.

Referring to FIG. 3, a similar graph is shown for an OFDM signal that has much harder compression. It can be seen that the ratio drops off much faster (as well as few right-most data points).

It is often the case that the compression will exhibit a dominant third-order characteristic. In this case, it is useful to fit a third-order polynomial to the ratio values with respect to the power values (e.g., least mean-square fit). The curves A and B of FIGS. 2 and 3, respectively, are such polynomials.

Then, for example, the third order term greater than three could be considered hard compression and between one and three could be considered medium compression.

As can be seen in FIGS. 2 and 3, it may be useful to plot the time signal comparisons on a graphical display device.

It should be pointed out that, typically, during demodulation of OFDM signals, the frequency domain data will have had operations performed that will tend to skew the inverse FFT time domain signal. Channel equalizers may be applied; pilots may be added to adjust magnitude and phase; and the magnitude and phase may be adjusted to minimize error vector magnitude (EVM).

To help the "times" of the measurement and the inverse FFT to line up, it is useful to perform the same level of correction on both the measured signal and the estimated ideal signal. Either the corrections can also be applied to the measured signal or they can be "un-applied" to the estimated ideal signal.

For example, in the un-applied case, the estimated ideal data is degraded with the application of the known linear impairments before the inverse FFT is performed. The impairments include any magnitude and phase alignment based on header, preamble or pilot information.

It should be evident that this disclosure is by way of example and that various changes may be made by adding, modifying or eliminating details without departing from the fair scope of the teaching contained in this disclosure. The invention is therefore not limited to particular details of this disclosure except to the extent that the following claims are necessarily so limited.

What is claimed is:

1. A method for measuring amplifier gain compression in an OFDM signal, said method comprising:

measuring said signal as a function of time to provide an observed time magnitude;

demodulating said OFDM signal to determine an estimate of the ideal signal constellation points;

performing an inverse FFT on the estimate of the ideal constellation points to produce an estimated ideal time magnitude;

comparing said observed time magnitude to said estimated ideal time magnitude to provide the measure of said amplifier gain compression.

2. A method according to claim 1, wherein said comparison is normalized with respect to the full scale value of said observed time magnitude.

3. A method according to claim 2, wherein a cubic equation is fitted to said normalized comparison.

4. A method according to claim 3, wherein the magnitude of the third order term of said equation is used as the measure of said amplifier gain compression.

5. A method according to claim 1, wherein said comparison is plotted on a graphical display device.

* * * * *